(12) United States Patent
Onishi et al.

(10) Patent No.: US 7,852,896 B2
(45) Date of Patent: Dec. 14, 2010

(54) VERTICAL CAVITY SURFACE EMITTING LASER

(75) Inventors: Yutaka Onishi, Yokohama (JP); Hideyuki Doi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 83 days.

(21) Appl. No.: 12/437,753

(22) Filed: May 8, 2009

(65) Prior Publication Data
US 2010/0014551 A1    Jan. 21, 2010

(30) Foreign Application Priority Data
Jul. 15, 2008    (JP)    ............... 2008-184254

(51) Int. Cl.
*H01S 5/00*    (2006.01)
(52) U.S. Cl. ............... 372/50.11; 372/50.124
(58) Field of Classification Search ............... 438/39; 372/44.011, 50.11; 257/103
See application file for complete search history.

(56) References Cited

U.S. PATENT DOCUMENTS 6,927,412 B2 *    8/2005    Takahashi et al. ............... 257/13
7,235,816 B2 *    6/2007    Takahashi et al. ............... 257/94
7,435,660 B2 *    10/2008    Johnson ....................... 438/401
7,714,338 B2 *    5/2010    Takahashi et al. ............... 257/94

OTHER PUBLICATIONS

"High-efficiency, high-speed VCSELs with deep oxidation layers", Chang et al., Electronic Letters, vol. 42, No. 22, (2006).

* cited by examiner

*Primary Examiner*—Minsun Harvey
*Assistant Examiner*—Tuan N. Nguyen
(74) *Attorney, Agent, or Firm*—Smith, Gambrell & Russell, LLP

(57) ABSTRACT

A VCSEL includes a GaAs substrate; a first semiconductor distributed Bragg reflector (DBR) disposed on the GaAs substrate and including a first part and a second part on the first part; a semiconductor mesa disposed on the first semiconductor DBR and including an active layer; and a second DBR on the semiconductor mesa. The first part is composed of an undoped semiconductor material. The second part includes third III-V compound semiconductor layers composed of a material containing indium and gallium as the group III element and phosphorus as the group V element and fourth III-V compound semiconductor layers composed of a material containing gallium as the group III element and arsenic as the group V element. The third III-V compound semiconductor layers and the fourth III-V compound semiconductor layers are doped with an n-type impurity.

11 Claims, 5 Drawing Sheets

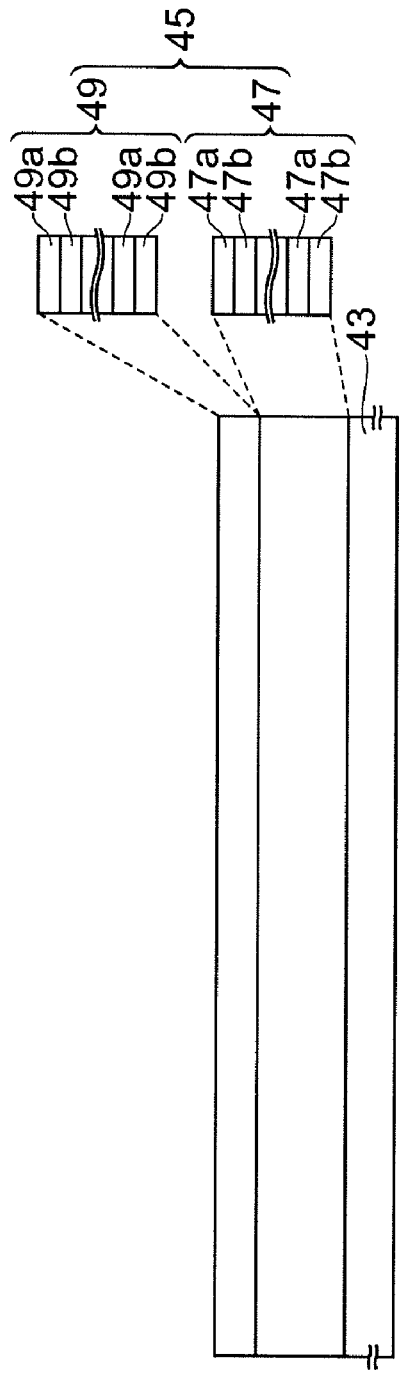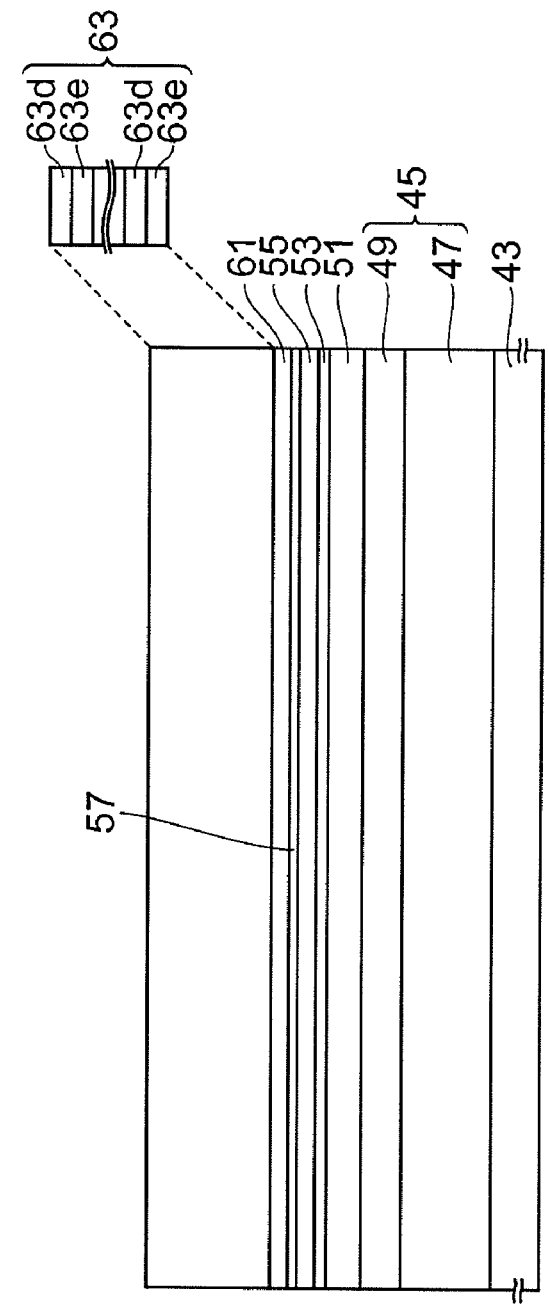

VERTICAL CAVITY SURFACE EMITTING LASER

BACKGROUND OF THE INVENTION

1. Field of the Invention

The present invention relates to vertical cavity surface emitting lasers.

2. Description of the Related Art

A non-patent document, Electronic Letters, vol. 42, no. 22, pp. 1281 to 1283, 2006, describes a vertical cavity surface emitting laser (VCSEL). This VCSEL includes a distributed Bragg reflector (DBR) disposed on a GaAs substrate. The DBR is constituted by n-type AlGaAs semiconductor layers and n-type GaAs semiconductor layers alternately stacked. These semiconductor layers are doped with an n-type impurity, Si. The DBR constitutes part of a cavity and also serves as a path for carriers to be supplied to an active layer.

SUMMARY OF THE INVENTION

In a VCSEL, two types of semiconductor layers having refractive indices significantly different from each other are alternately stacked to obtain a DBR achieving a high reflectivity. In the non-patent document described above, an n-type AlGaAs and an n-type GaAs having refractive indices significantly different from each other are used in the DBR. These semiconductors contain silicon (Si) as an n-type dopant. A DX center is formed in an n-type AlGaAs semiconductor with an aluminum (Al) content of 0.3 or more. The DX center decreases the electrical activity of the impurity (dopant) atoms in an n-type AlGaAs. Accordingly, in order to achieve a sufficient carrier concentration, the semiconductor must be heavily doped with an n-type impurity such as Si. Furthermore, the impurity (dopant) atoms being electrically inactive increase when semiconductor layers are excessively doped. It is known in general that the n-type impurity (dopant) atoms becoming electrically inactive receive light from an active layer of light-emitting devices and thereby move between lattice sites in the semiconductor layers. Due to this movement of the n-type impurity (dopant) atoms, interdiffusion of Al atoms in the AlGaAs semiconductor layers and Ga atoms in the GaAs semiconductor layers occurs. This interdiffusion changes the compositions of the AlGaAs semiconductor layers and the GaAs semiconductor layers and narrows the difference in refractive index between the two types of semiconductor layers, resulting in a decreased reflectivity of the DBR. As a result, deterioration of emission characteristics, such as decreased optical output, of the VCSEL occurs.

In contrast, the electrical activity of the p-type impurity in a p-type AlGaAs is substantially 100% and a desired carrier concentration can be achieved without excessive doping. Since p-type impurity (dopant) atoms stably remain on the lattice, the p-type impurity (dopant) atoms in the DBR do not undergo interdiffusion and the reflectivity of the DBR does not decrease.

The present invention provides a vertical cavity surface emitting laser (VCSEL) with which deterioration of emission characteristics such as a decrease in optical output caused by fluctuation of DBR's reflectivity can be suppressed.

An aspect of the present invention provides a vertical cavity surface emitting laser that includes a GaAs substrate; a first semiconductor distributed Bragg reflector disposed on the GaAs substrate, the first semiconductor distributed Bragg reflector including a first part and a second part on the first part; a semiconductor mesa disposed on the first semiconductor distributed Bragg reflector, the semiconductor mesa including an active layer; and a second distributed Bragg reflector on the semiconductor mesa. The second part of the first semiconductor distributed Bragg reflector includes a first region and a second region surrounding the first region; the semiconductor mesa is disposed on the first region; the first part of the first semiconductor distributed Bragg reflector includes first III-V group compound semiconductor layers and second III-V group compound semiconductor layers that are alternately stacked; the second part of the first semiconductor distributed Bragg reflector includes third III-V group compound semiconductor layers and fourth III-V group compound semiconductor layers that are alternately stacked; the first III-V group compound semiconductor layers are composed of an undoped semiconductor material containing aluminum and gallium as the group III element and arsenic as the group V element; the second III-V group compound semiconductor layers are composed of an undoped semiconductor material containing gallium as the group III element and arsenic as the group V element; the third III-V group compound semiconductor layers are composed of a semiconductor material that contains indium and gallium as the group III element and phosphorus as the group V element; the fourth III-V group compound semiconductor layers are composed of a semiconductor material that contains gallium as the group III element and arsenic as the group V element; and the third III-V group compound semiconductor layers and the fourth III-V group compound semiconductor layers are doped with an n-type impurity.

According to this vertical cavity surface emitting laser, the third III-V group compound semiconductor layers in the second part of the first semiconductor distributed Bragg reflector are composed of a semiconductor containing indium (In), gallium (Ga), and phosphorus (P). Thus, no DX center is formed in the third III-V group semiconductor layers. Thus, the electrical activity of the n-type impurity in the second part of the first semiconductor distributed Bragg reflector does not substantially decrease. The impurity concentration of the second part of the first semiconductor distributed Bragg reflector to obtain a sufficient carrier density can thereby be decreased. When the impurity concentration is low, the impurity (dopant) atoms stably remain on the lattice sites and do not easily move between lattices even when irradiated with light from the active layer. Thus, occurrence of interdiffusion of constituent atoms between the third III-V group compound semiconductor layers and the fourth III-V group compound semiconductor layers is reduced. Deterioration of the reflectivity of the distributed Bragg reflector is suppressed.

In the second part of the first semiconductor distributed Bragg reflector, electrical current flow in the first region and the second region of the second part of the first semiconductor distributed Bragg reflector through the third III-V group compound semiconductor layers and the fourth III-V group compound semiconductor layers composed of an n-type semiconductor. Thus, a path through which carriers are supplied from the second part to the active layer is provided. Moreover, the first part of the first semiconductor distributed Bragg reflector is composed of an undoped semiconductor material. Thus, impurity concentration in the first part of the first semiconductor distributed Bragg reflector is very low and few impurity atoms move between lattice sites when irradiated with a laser beam. Thus, interdiffusion of constitutional elements between the first III-V group compound semiconductor layers and the second III-V group compound semiconductor layers is avoided. Thus, deterioration of the reflectivity of the distributed Bragg reflector is suppressed.

In this vertical cavity surface emitting laser, the difference in refractive index between the first III-V group compound semiconductor layers and the second III-V group compound semiconductor layers is larger than the difference in refractive index between the third III-V group compound semiconductor layers and the fourth III-V group compound semiconductor layers. Furthermore, the pair number of the first part of the first semiconductor distributed Bragg reflector is in a range from 20 to 40, and the pair number of the second part of the first semiconductor distributed Bragg reflector is in a range from 2 to 10. Thus, the reflectivity of the first part of the first semiconductor distributed Bragg reflector is larger than the reflectivity of the second part. Thus, the first semiconductor distributed Bragg reflector as a whole has a sufficient reflectivity.

In this vertical cavity surface emitting laser, the n-type impurity concentration of the second part of the first semiconductor distributed Bragg reflector is more than or equal to $5 \times 10^{17}$ cm$^{-3}$ and less than or equal to $5 \times 10^{18}$ cm$^{-3}$.

At an n-type impurity concentration of the second part of the first semiconductor distributed Bragg reflector within the above-described numerical range, a VCSEL having a low resistance and a high reflectivity of the DBR is obtained because a diffusion of impurity atoms into adjacent layers and an interdiffusion of elements are prevented.

In this vertical cavity surface emitting laser, the first III-V group compound semiconductor layers may be composed of an AlGaAs semiconductor or an AlAs semiconductor, and the second III-V group compound semiconductor layers are composed of a GaAs semiconductor or an AlGaAs semiconductor.

In this vertical cavity surface emitting laser, the third III-V group compound semiconductor layers may be composed of an InGaP semiconductor, an AlGaInP semiconductor, or a GaInAsP semiconductor.

In this vertical cavity surface emitting laser, the first part of the first semiconductor distributed Bragg reflector preferably has compressive strain; the In content in the group III element of the third III-V group compound semiconductor layers is preferably 0.4 or more and 0.5 or less; the fourth III-V group compound semiconductor layers are preferably composed of a GaAs semiconductor; and the second part of the first semiconductor distributed Bragg reflector preferably has tensile strain.

At an In content within the above-described numerical range, the third III-V group compound semiconductor layers are lattice-matched with or have tensile strain for the GaAs semiconductor while the second part of the first semiconductor distributed Bragg reflector has tensile strain. Thus, the second part of the first semiconductor distributed Bragg reflector can compensate for the compressive strain of the first part. Since the stress to the active layer is reduced as a result of the compensation, the reliability of the laser element can be improved. Moreover, since the In content is in the above-described numerical range, the second part of the first semiconductor distributed Bragg reflector has good surface morphology.

In the vertical cavity surface emitting laser, the first part of the first semiconductor distributed Bragg reflector preferably has compressive strain; the In content in the group III element of the third III-V group compound semiconductor layers is preferably 0.4 or more and 0.6 or less; the fourth III-V group compound semiconductor layers are preferably composed of a GaAsP semiconductor; and the second part of the first semiconductor distributed Bragg reflector preferably has tensile strain.

The GaAsP semiconductor constituting the third III-V group compound semiconductor layers have tensile strain for the GaAs semiconductor. When the In content is within the above-described numerical range, the second part of the first semiconductor distributed Bragg reflector has tensile strain. Accordingly, the second part of the first semiconductor distributed Bragg reflector can compensate for the compressive strain that occurs in the first part. Since the stress to the active layer is reduced by the compensation, degradation of the reliability of the laser element can be suppressed. Since the In content is within the above-described numerical range, the second part of the first semiconductor distributed Bragg reflector exhibits good surface morphology.

The vertical cavity surface emitting laser may further include an insulator layer disposed on the second region of the second part of the first semiconductor distributed Bragg reflector and a side surface of the semiconductor mesa, the insulator layer having an opening in a portion of the insulator layer on the second region; a first electrode formed in the opening; and a second electrode formed on the semiconductor mesa and the insulator layer. The active layer may have a quantum well structure including InGaAs well layers.

Further objects, features, and advantages of the invention as well as those described above will become more apparent from consideration of the detailed description of the invention below and the attached drawings showing examples of the invention.

BRIEF DESCRIPTION OF THE DRAWINGS

FIG. 2A is a diagram showing a step of making a vertical cavity surface emitting laser and FIG. 2B is a diagram showing a step of making the vertical cavity surface emitting laser subsequent to the step shown in FIG. 2A;

DESCRIPTION OF THE PREFERRED EMBODIMENTS

Figure 1:
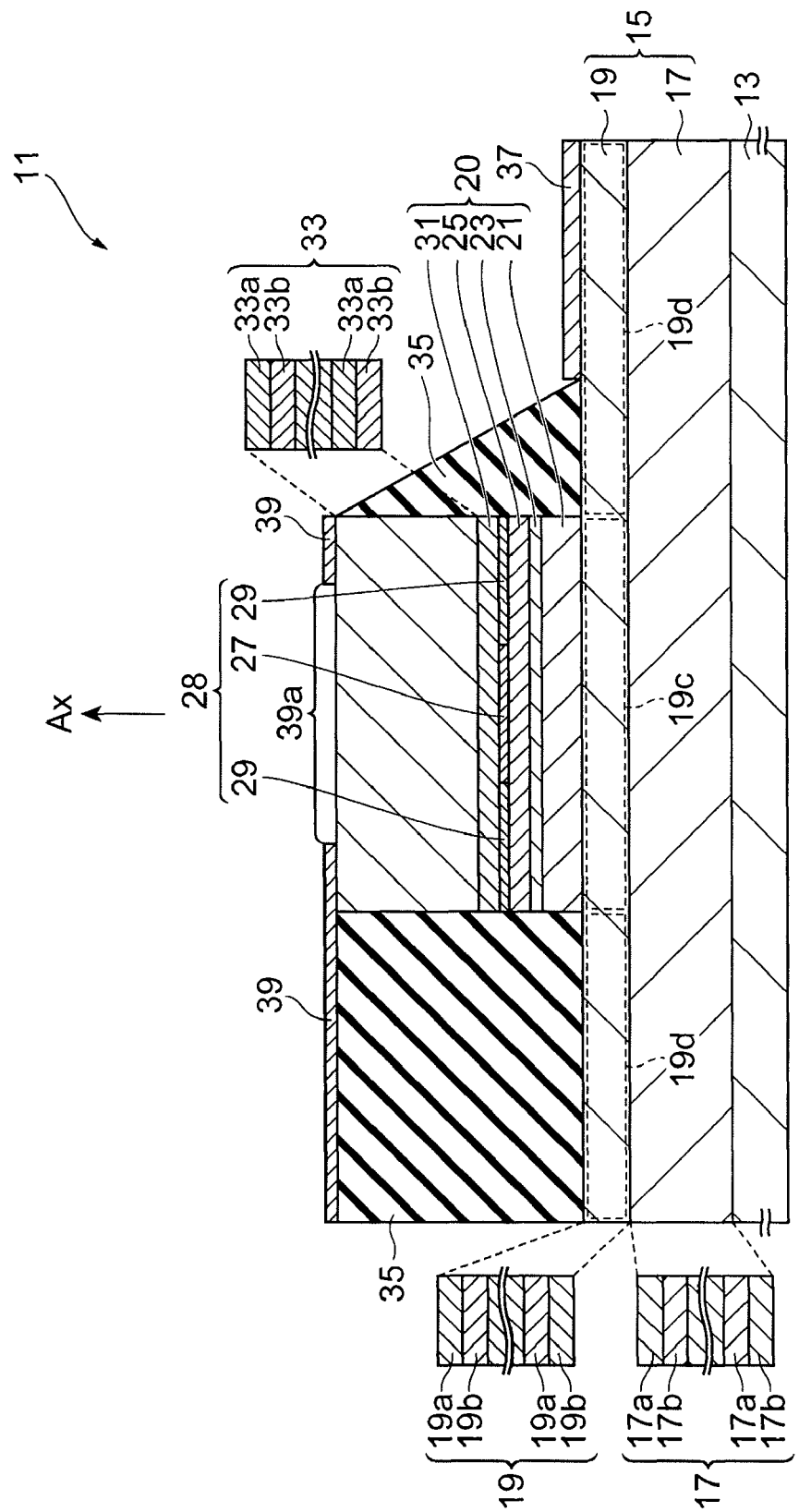
FIG. 1 is a schematic cross-sectional view of a vertical cavity surface emitting laser according to one embodiment.

The findings of the prevent invention can be readily understood from the detailed description provided below taken together with the attached drawings showing examples of the present invention. Vertical cavity surface emitting lasers (VCSELs) according to preferred embodiments of the present invention will now be described with reference to the attached drawings. Equivalent components are represented by the same reference characters if appropriate.

FIG. 1 is a schematic cross-sectional view of a VCSEL according to one embodiment. The structure of a VCSEL 11 is described with reference to FIG. 1. The VCSEL 11 includes a first distributed Bragg reflector (referred to as "first DBR" hereinafter) 15, a semiconductor mesa 20, a second distributed Bragg reflector (referred to as "second DBR" hereinafter) 33. The semiconductor mesa 20 includes an active layer 23.

The first DBR 15 is disposed on a substrate 13. The substrate 13 may be, for example, a semi-insulating GaAs substrate. The first DBR 15 includes a first part 17 and a second part 19. The second part 19 is disposed on the first part 17.

The first part 17 of the first DBR 15 includes first III-V group compound semiconductor layers 17a and second III-V group compound semiconductor layers 17b that are alternately stacked. The first part 17 of the first DBR 15 includes more than or equal to twenty pairs of semiconductor layers that are alternately stacked. The first part 17 of the first DBR 15 includes less than or equal to forty pairs of semiconductor layers that are alternately stacked. The first part 17 of the first DBR 15 includes, for example, thirty-two pairs of semiconductor layers that are alternately stacked. The first III-V group compound semiconductor layers 17a are composed of an undoped semiconductor material that contains aluminum (Al) and gallium (Ga) as the group III elements and arsenic (As) as the group V element. The first III-V group compound semiconductor layers 17a may be composed of, for example, an undoped AlGaAs semiconductor. The second III-V group compound semiconductor layers 17b are composed of an undoped semiconductor material that contains gallium (Ga) as the group III element and arsenic (As) as the group V element. The second III-V group compound semiconductor layers 17b may be composed of, for example, an undoped GaAs or AlGaAs semiconductor. Since the first part 17 of the first DBR 15 is composed of an undoped semiconductor material in which no impurity (dopant) is doped intentionally, impurity concentration is low in the first part 17. The impurity concentration of the first part 17 is lower than the impurity concentration of $3 \times 10^{17}$ cm$^{-3}$. Thus, interdiffusion of constitutional elements caused by movement of impurity atoms between the lattice sites does not occur between the first III-V group compound semiconductor layers 17a and the second III-V group compound semiconductor layers 17b. Therefore, the decrease in reflectivity of the DBR is suppressed.

When the first III-V group compound semiconductor layers 17a of the first part 17 of the first DBR 15 are composed of an AlGaAs semiconductor and the second III-V group compound semiconductor layers 17b are composed of a GaAs semiconductor or an AlGaAs semiconductor, the first III-V group compound semiconductor layers 17a and the second III-V group compound semiconductor layers 17b are nearly lattice-matched with GaAs. However, the lattice constant of the first III-V group compound semiconductor layers 17a is very slightly larger than that of the second III-V group compound semiconductor layers 17b. Since more than twenty pairs of semiconductor layers are alternately stacked in the first part 17 of the first DBR 15, even this slight difference in lattice constant causes lattice strain. Thus, the first part 17 of the first DBR 15 has compressive strain due to the difference in lattice constant between the first III-V group compound semiconductor layers 17a and the second III-V group compound semiconductor layers 17b.

The second part 19 of the first DBR 15 includes third III-V group compound semiconductor layers 19a and fourth III-V group compound semiconductor layers 19b alternately stacked. The second part 19 of the first DBR 15 includes more than or equal to two pairs of semiconductor layers that are alternately stacked. The second part 19 of the first DBR 15 includes less than or equal to ten pairs of semiconductor layers that are alternately stacked. For example, three pairs of semiconductor layers are alternately stacked.

The third III-V group compound semiconductor layers 19a of the second part 19 of the first DBR 15 are composed of a material that contains indium (In) and gallium (Ga) as the group III elements and phosphorus (P) as the group V element. The DX center would be formed in an n-type AlGaAs semiconductor with a high Al content. However, the DX center is not formed in the third III-V group compound semiconductor layers 19a composed of a material that contains indium (In) and gallium (Ga) as the group III elements and phosphorus (P) as the group V element even if the third III-V group compound semiconductor layers 19a is doped with an n-type impurity such as Si. Thus, the electrical activity of the n-type impurity in the second part 19 of the first DBR 15 is prevented from decreasing, and a sufficient carrier concentration can be achieved with a low impurity concentration. At a low impurity concentration, the impurity (dopant) atoms stably remain on the lattice sites and do not easily move between lattices even when light is applied to the impurity (dopant) atoms from the active layer. Accordingly, interdiffusion of constitutional elements between the third III-V group compound semiconductor layers 19a and the fourth III-V group compound semiconductor layers 19b does not occur, and the decrease in the reflectivity of the second part 19 of the first DBR 15 is suppressed. The third III-V group compound semiconductor layers 19a may be composed of, for example, an InGaP semiconductor, an AlGaInP semiconductor, or a GaInAsP semiconductor doped with an n-type impurity. The n-type impurity concentration of third III-V group compound semiconductor layers 19a is, for example, more than or equal to $5 \times 10^{17}$ cm$^{-3}$ to obtain a low resistance of a VCSEL device. The n-type impurity concentration of third III-V group compound semiconductor layers 19a is, for example, less than or equal to $5 \times 10^{18}$ cm$^{-3}$. At a impurity concentration of more than $5 \times 10^{18}$ cm$^{-3}$, diffusion of impurity atoms into adjacent layers becomes significant, interdiffusion of elements occurs, and the reflectivity of the DBR is lowered.

The fourth III-V group compound semiconductor layers 19b are composed of a semiconductor material doped with an n-type impurity. The n-type impurity concentration of fourth III-V group compound semiconductor layers 19b is, for example, more than or equal to $5 \times 10^{17}$ cm$^{-3}$ and less than or equal to $5 \times 10^{18}$ cm$^{-3}$. At an n-type impurity concentration of the second part 19 of the first DBR 15 within the above-described numerical range, a VCSEL having a low resistance and a high reflectivity of the DBR is obtained because a diffusion of impurity atoms into adjacent layers and an interdiffusion of elements are prevented. The semiconductor material contains gallium (Ga) as the group III element and arsenic (As) as the group V element. The fourth III-V group compound semiconductor layers 19b may be composed of, for example, an n-type GaAs or an n-type GaAsP semiconductor.

In the case where the fourth III-V group compound semiconductor layers 19b are composed of an n-type GaAs semiconductor doped with an n-type impurity, the In content in the total group III element content of the third III-V group compound semiconductor layers 19a is preferably 0.4 or more and 0.5 or less. At an In content within the above-described numerical range, the third III-V group compound semiconductor layers 19a are lattice-matched with or have tensile strain for the GaAs semiconductor while the second part 19 of the first DBR 15 has tensile strain. Accordingly, the second part 19 of the first DBR 15 can compensate for the compressive strain in the first part 17. Since the stresses applied from the first part 17 to the active layer 23 are reduced, the reliability of the laser element improves. Furthermore, in the case of the In content within the above-described numerical range, the second part 19 of the first DBR 15 exhibits good surface morphology after growing the second part 19 of the first DBR 15.

In the case where the fourth III-V group compound semiconductor layers 19b are composed of an n-type GaAsP semiconductor doped with an n-type impurity, the In content in the total group III element content of the third III-V group compound semiconductor layers 19a is preferably 0.4 or more and 0.6 or less. The GaAsP semiconductor constituting the fourth III-V group compound semiconductor layers 19b has tensile strain. When the In content of the third III-V group compound semiconductor layers 19a is within the above-described numerical range, the second part 19 of the first DBR 15 has tensile strain. Accordingly, the second part 19 of the first DBR 15 can compensate for the compressive strain in the first part 17. Since the stresses applied from the first part 17 to the active layer 23 are reduced, the reliability of the laser element can be improved. Moreover, when the In content is within the above-described numerical range, the second part 19 of the first DBR 15 exhibits good surface morphology after growing the second part 19 of the first DBR 15.

The difference in refractive index between the first III-V group compound semiconductor layers 17a and the second III-V group compound semiconductor layers 17b is larger than the difference in refractive index between the third III-V group compound semiconductor layers 19a and the fourth III-V group compound semiconductor layers 19b. Furthermore, number of pairs of semiconductor layers of the first part 17 of the first DBR 15 is lager than that of the second part 19 of the first DBR 15. Thus, the reflectivity of the first part 17 of the first DBR 15 is larger than that of the second part 19. The first DBR 15 exhibits a sufficient reflectivity as a whole.

The second part 19 of the first DBR 15 has a first region 19c and a second region 19d surrounding the first region 19c. Since the second part 19 of the first DBR 15 includes semiconductor layers composed of an n-type semiconductor, carriers can move between the first region 19c and the second region 19d.

An electrically conductive intermediate layer may be provided between the first part 17 and the second part 19 of the first DBR 15. The thickness of the intermediate layer is, for example, an integral multiple of $\lambda/4n$ ($\lambda$: emission wavelength, n: integer).

The semiconductor mesa 20 is disposed on the first region 19c of the second part 19 of the first DBR 15. The semiconductor mesa 20 includes a first spacer layer 21, the active layer 23, a second spacer layer 25, a current confinement layer 28, and a third spacer layer 31. The second DBR 33 is disposed on the semiconductor mesa 20.

The first spacer layer 21 is disposed on the first region 19c of the second part 19 of the first DBR 15. The first spacer layer 21 is composed of, for example, an n-type GaAs semiconductor doped with an n-type impurity. The thickness of the first spacer layer 21 is, for example, 40 nm.

The active layer 23 is disposed on the first spacer layer 21. The active layer 23 may provide the quantum well structure comprising a plurality of well layers and a plurality of barrier layers also alternately stacked to each other. For example, the active layer 23 has a quantum well structure including $In_{0.2}Ga_{0.8}As$ well layers and GaAs barrier layers and number of $In_{0.2}Ga_{0.8}As$ well layers equals to three (3QW structure).

The second spacer layer 25 is disposed on the active layer 23. The second spacer layer 25 is composed of, for example, a p-type GaAs semiconductor. The thickness of the second spacer layer 25 is, for example, 40 nm.

The current confinement layer 28 is disposed on the second spacer layer 25. The current confinement layer 28 includes a first part 27 and a circular second part 29 that surrounds the first part 27. The first part 27 of the current confinement layer 28 is composed of, for example, a p-type AlGaAs semiconductor. The second part 29 of the current confinement layer 28 contains an aluminum oxide ($Al_2O_3$) and has a resistivity higher than that of the first part 27. The second part 29 is formed by, for example, selectively oxidizing the AlGaAs semiconductor to $Al_2O_3$. The first part 27 serves as a path for carriers. The thickness of the current confinement layer 28 may be, for example, 15 nm.

A third spacer layer 31 is disposed on the current confinement layer 28. The third spacer layer 31 is composed of, for example, a p-type GaAs semiconductor. The thickness of the third spacer layer 31 is, for example, 20 nm.

The second DBR 33 is disposed on the third spacer layer 31. The second DBR 33 includes fifth III-V group compound semiconductor layers 33a and sixth III-V group compound semiconductor layers 33b alternately stacked. For example, the second DBR 33 includes twenty-two pairs of semiconductor layers alternately stacked. The fifth III-V group compound semiconductor layers 33a are composed of, for example, a p-type AlGaAs semiconductor. The sixth III-V group compound semiconductor layers 33b are composed of, for example, a p-type GaAs semiconductor.

An insulator layer 35 is disposed on the second region 19d of the second part 19 of the first DBR 15 and surrounds the side surface of the semiconductor mesa 20. The insulator layer 35 is composed of, for example, a polyimide resin, bisbenzocyclobutene (BCB) resin, and dielectric film such as $SiO_2$, SiN and SiON. Preferably, a thickness of the insulator layer 35 is as thick as the side surfaces of the semiconductor mesa 20 and the second DBR 33 is fully buried with the insulator layer 35 to planerize the top surface of VCSEL device, as shown in FIG. 1.

A first electrode 37 is disposed on the second region 19d of the second part 19 of the first DBR 15. The first electrode 37 is electrically connected to the second region 19d of the second part 19.

A second electrode 39 is disposed on the semiconductor mesa 20 and the insulator layer 35. The second electrode 39 has an opening 39a. The opening 39a is provided on a particular axis Ax that extends from the first region 19c of the second part 19 of the first DBR 15 to the first part 27 of the current confinement layer 28. Part of the second DBR 33 is exposed at the opening 39a.

In the description above, the impurity in the n-type semiconductor is, for example, silicon (Si). Other examples of the n-type impurity include selenium (Se), tellurium (Te), sulfur (S), and tin (Sn).

In this embodiment, the second DBR 33 is described as including the fifth III-V group compound semiconductor layers 33a and the sixth III-V group compound semiconductor layers 33b alternately stacked. Alternatively, the second DBR 33 may be a multilayer dielectric DBR film including alternately stacked dielectric films. For example, a multilayer dielectric DBR film including a combination of $SiO_2$ and $TiO_2$ may be used as the second DBR 33.

Next, one example of steps of a method of making the VCSEL of this embodiment is described with reference to FIGS. 2A to 3B.

As shown in FIG. 2A, a first DBR 45 is formed on a semi-insulating GaAs substrate 43. The first DBR 45 is constituted by a first part 47 and a second part 49. In the first part 47, first III-V group compound semiconductor layers 47a and second III-V group compound semiconductor layers 47b are alternately grown. The first part 47 is constituted by, for example, thirty-two pairs of semiconductor layers. The first III-V group compound semiconductor layers 47a are composed of, for example, an undoped $Al_{0.9}Ga_{0.1}As$ semiconductor. The second III-V group compound semiconductor layers 47b are composed of, for example, an undoped GaAs semiconductor. The impurity concentration of the first part 47 composed of undoped III-V group compound semiconductor layers is, for example, lower than the impurity concentration of $3\times10^{17}$ cm$^{-3}$. In the second part 49, third III-V group semiconductor layers 49a and fourth III-V group semiconductor layers 49b are alternately grown. The second part 49 is constituted by, for example, three pairs of semiconductor layers. The third III-V group semiconductor layers 49a are composed of, for example, an n-type In$_{0.5}$Ga$_{0.5}$P semiconductor doped with Si. The fourth III-V group semiconductor layers 49b are composed of, for example, an n-type GaAs semiconductor doped with Si. The n-type impurity concentration of the second part 49 is, for example, $1\times10^{18}$ cm$^{-3}$.

As shown in FIG. 2B, a plurality of semiconductor layers that constitute the semiconductor mesa are continuously grown on the first DBR 45. These semiconductor layers are grown by metal-organic vapor phase epitaxy (MOVPE). A first spacer layer 51 is grown on the first DBR 45. The first spacer layer 51 is composed of, for example, an n-type GaAs semiconductor doped with Si and has a thickness of, for example, 40 nm.

An active layer 53 is grown on the first spacer layer 51. The active layer 53 has a quantum well structure including three In$_{0.2}$Ga$_{0.8}$As well layers (3-quantum well structure).

A second spacer layer 55 is grown on the active layer 53. The second spacer layer 55 is composed of, for example, a p-type GaAs semiconductor doped with carbon (C) and has a thickness of, for example, 40 nm.

A current confinement layer 57 is grown on the second spacer layer 55. The current confinement layer 57 is composed of, for example, a p-type Al$_{0.96}$Ga$_{0.04}$As semiconductor doped with C and has a thickness of, for example, 15 nm.

A third spacer layer 61 is grown on the current confinement layer 57. The third spacer layer 61 is composed of, for example, a p-type GaAs semiconductor doped with C and has a thickness of, for example, 20 nm.

A second DBR semiconductor layer 63 is grown on the third spacer layer 61. In the second DBR semiconductor layer 63, fifth III-V group compound semiconductor layers 63a and sixth III-V group compound semiconductor layers 63b are grown alternately. The second DBR semiconductor layer 63 includes, for example, twenty-two pairs of semiconductor layers. The fifth III-V group compound semiconductor layers 63a are composed of, for example, a p-type Al$_{0.9}$Ga$_{0.1}$As semiconductor doped with C. The sixth III-V group compound semiconductor layers 63b are composed of, for example, a p-type GaAs semiconductor doped with C.

Figure 3A:
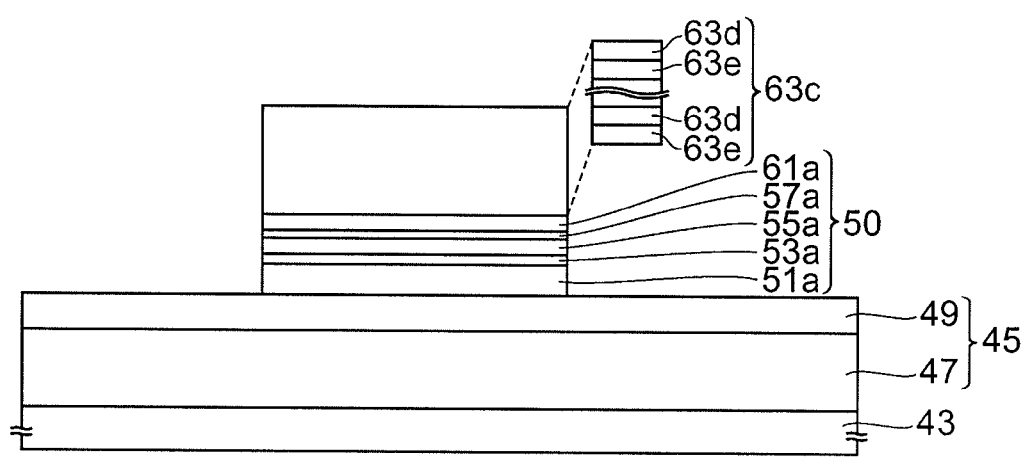
FIG. 3A is a diagram showing a step of making the vertical cavity surface emitting laser subsequent to the step show in FIG. 2B.

Next, as shown in FIG. 3A, a semiconductor mesa 50 and a second DBR 63c are formed on a first region 49c in the second part 49 of the first DBR 45 by dry etching through a resist mask formed on the semiconductor layer. The resist mask has, for example, a circular shape and a diameter of 30 μm, for example.

Figure 3B:
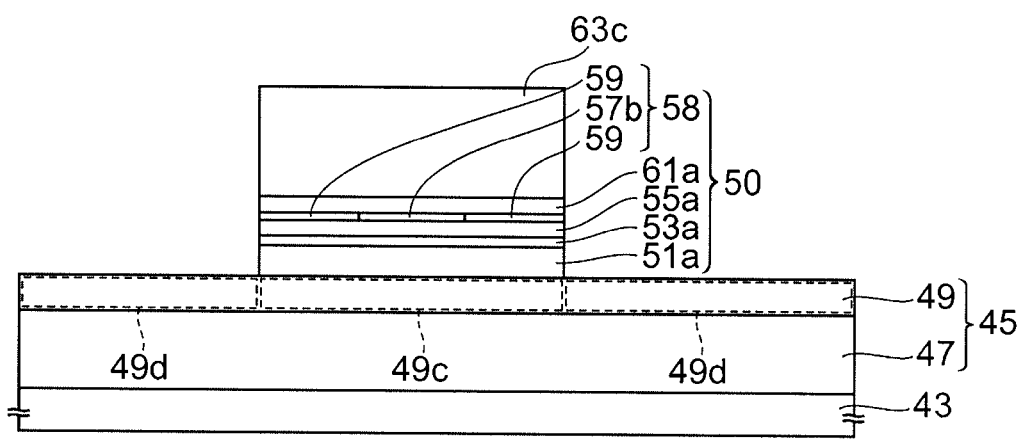
FIG. 3B is a diagram showing a step of making the vertical cavity surface emitting laser subsequent to the step shown in FIG. 3A.

As shown in FIG. 3B, part of a current confinement layer 58 is selectively oxidized in a water vapor atmosphere at 480° C. to form a first part 57b and a second part 59 of the current confinement layer 58. In the process of selectively oxidizing the current confinement layer 58, the AlGaAs layers of the current confinement layer 58 exposed at the side surface of the semiconductor mesa 50 become oxidized to form an aluminum oxide (Al$_2$O$_3$). The oxidation progresses from the side surface of the semiconductor mesa 50 toward the center of the semiconductor mesa 50. In the current confinement layer 58, the part containing an aluminum oxide (Al$_2$O$_3$) produced by oxidation of AlGaAs forms the second part 59. The second part 59 is circular and surrounds the first part 57b. The second part 59 containing the aluminum oxide (Al$_2$O$_3$) has a high electrical resistance and thus electrical current injected from an electrode can be concentrated on the first part 57b.

Next, an insulator layer is formed so that the side surfaces of the semiconductor mesa 50 and the second DBR 63c are buried to planarize the top surface of the VCSEL device. The insulator layer is composed of, for example, a polyimide resin, bisbenzocyclobutene (BCB) resin, and dielectric film such as SiO$_2$, SiN and SiON. Furthermore, the insulator layer may be composed of two layers of, for example, a dielectric film and a polyimide resin disposed on the dielectric film. Next, part of the insulator layer is etched to expose part of a second region 49d in the second part 49 of the first DBR 45 to form an opening. A first electrode is formed in the opening on the exposed second region 49d. The first electrode is electrically connected to the second region 49d in this opening. A second electrode is formed on the semiconductor mesa 50 and the insulator layer. When the second DBR 63c is constituted by a semiconductor DBR, the second electrode is formed on the second DBR 63c. In forming the second electrode, an opening (opening 39a in FIG. 1) for outputting light from the VCSEL is formed. The electrodes are formed by, for example, evaporation method. Through these steps, the VCSEL 11 of the present embodiment shown in FIG. 1 is fabricated.

Figure 4:
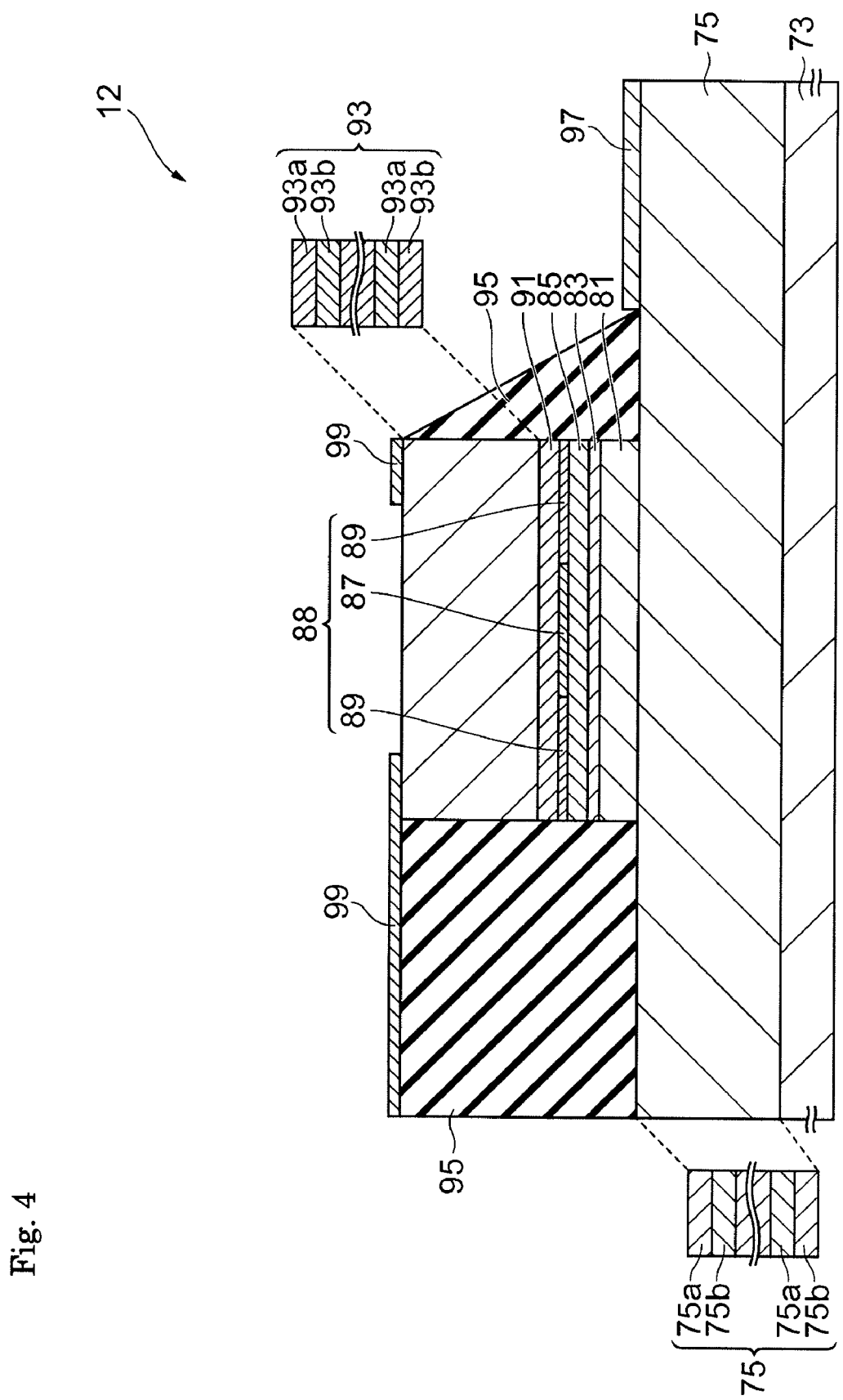
FIG. 4 is a schematic cross-sectional view of a vertical cavity surface emitting laser of a comparative example.

For purposes of comparing the VCSEL of this embodiment (referred to as "semiconductor laser A" hereinafter), a comparative example VCSEL (referred to as "semiconductor laser B" hereinafter) having a structure shown in FIG. 4 was fabricated. The structure of the semiconductor laser A is shown in FIG. 1 and as follows:

Substrate 13: Semi-insulating GaAs semiconductor
First part 17 of first DBR 15: Thirty-two pairs of undoped Al$_{0.9}$Ga$_{0.1}$As/GaAs layers
Second part 19 of first DBR 15: Three pairs of Si-doped In$_{0.5}$Ga$_{0.5}$P/GaAs layers, impurity concentration: $1\times10^{18}$ cm$^{-3}$
First spacer layer 21: Si-doped GaAs, 40 nm in thickness
Active layer 23: 3QW having three In$_{0.2}$Ga$_{0.8}$As well layers
Second spacer layer 25: C-doped GaAs, 40 nm in thickness
Current confinement layer 28: C-doped Al$_{0.96}$Ga$_{0.04}$As, 15 nm in thickness
Third spacer layer 31: C-doped GaAs, 20 nm in thickness
Second DBR 33: Twenty-two pairs of Al$_{0.9}$Ga$_{0.1}$As/GaAs layers In the semiconductor laser B shown in FIG. 4, a first DBR 75 is constituted by AlGaAs layers and GaAs layers alternately stacked. The parts other than the first DBR 75 are identical to those of the semiconductor laser A. The structure of the semiconductor laser B is as follows:

Substrate 73: Semi-insulating GaAs semiconductor
First DBR 75: Thirty-five pairs of Si-doped Al$_{0.9}$Ga$_{0.1}$As/GaAs layers, impurity concentration: $6\times10^{18}$ cm$^{-3}$
First spacer layer 81: Si-doped GaAs, 40 nm in thickness
Active layer 83: 3QW having three In$_{0.2}$Ga$_{0.8}$As well layers
Second spacer layer 85: C-doped GaAs, 40 nm in thickness
Current confinement layer 88: C-doped Al$_{0.96}$Ga$_{0.04}$As, 15 nm in thickness
Third spacer layer 91: C-doped GaAs, 20 nm in thickness
Second DBR 93: Twenty-two pairs of Al$_{0.9}$Ga$_{0.1}$As/GaAs The emission wavelength, threshold current, maximum output power, and differential resistance of the semiconductor lasers A and B are as follows:
Semiconductor Laser A
  Emission wavelength: 980 nm
  Threshold current: 0.5 mA
  Maximum output power: 6 mW
  Differential resistance: 110Ω
Semiconductor Laser B
  Emission wavelength: 980 nm
  Threshold current: 0.5 mA Maximum output power: 5.1 mW Differential resistance: 240Ω

The differential resistance of the semiconductor laser A is smaller than the differential resistance of the semiconductor laser B. The hetero-barrier of the conduction band at the interface between InGaP and GaAs in the first DBR 15 of the semiconductor laser A is smaller than the hetero-barrier of the conduction band at the interface between AlGaAs and GaAs in the first DBR 75 of the semiconductor laser B. Accordingly, the semiconductor laser A has a smaller differential resistance than the comparative semiconductor laser B.

The maximum output power of the semiconductor laser A is greater than the maximum output power of the comparative semiconductor laser B. Since the differential resistance of the semiconductor laser A is smaller than that of the comparative semiconductor laser B, the amount of heat generated from the element of the semiconductor laser A is suppressed compared to that generated from the element of the semiconductor laser B. The maximum output power of the semiconductor laser A is improved by such suppression of the amount of heat.

Figure 5:
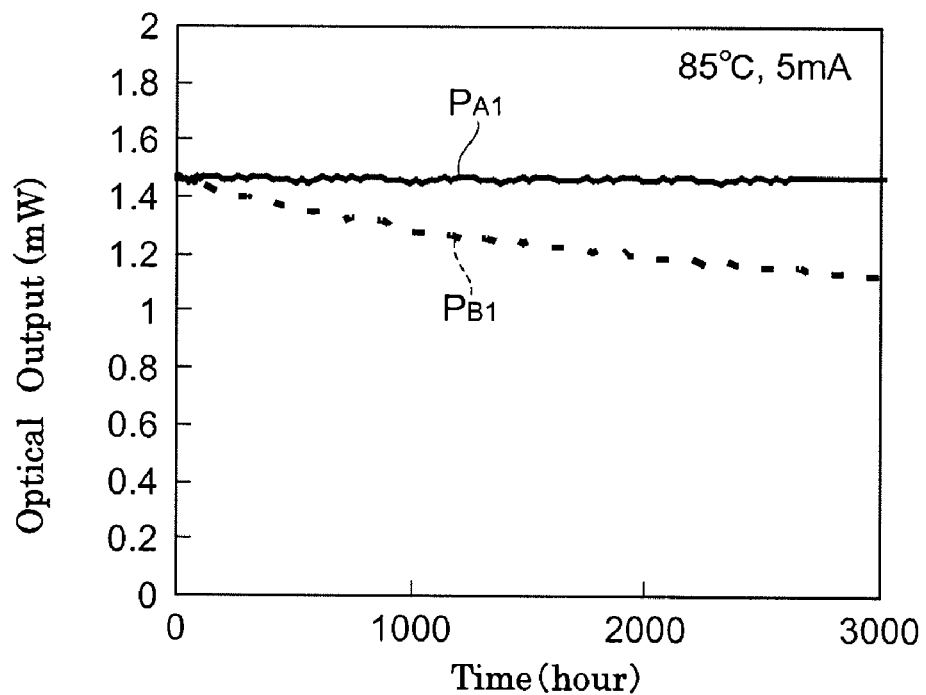
FIGS. 5A and 5B are graphs showing the results of a long-term current test of vertical cavity surface emitting lasers of the embodiment and the comparative example.

The results of a long-term current test of the semiconductor laser A and the comparative semiconductor laser B are shown in FIG. 5A. The test conditions were a temperature of 85° C. and driving at 5 mA auto current control (ACC). As marked by reference character $P_{A1}$, the output power of the semiconductor laser A did not substantially change over 3,000 hours. In contrast, as marked by reference character $P_{B1}$, the output power of the comparative semiconductor laser B decreased with time.

With the comparative semiconductor laser B, a DX center is formed since the Al content of 0.9 in the AlGaAs semiconductor of the first DBR 75 is more than 0.3. The electrical activity of the n-type impurity such as Si becomes low due to the DX center in the AlGaAs semiconductor of the first DBR 75. Thus, in order to obtain a sufficient carrier density, the n-type impurity concentration is set high. In the semiconductor layer heavily doped with Si as an n-type dopant, Si atoms diffuse by energy of the light emitted from the active layer. This diffusion of Si atoms causes interdiffusion of Al atoms in the AlGaAs semiconductor and Ga atoms in the GaAs semiconductor. The interdiffusion deteriorates the reflectivity of the first DBR 75 and decreases the output power.

In contrast, in the semiconductor laser A, the second part 19 of the first DBR 15 is composed of an InGaP semiconductor. Thus no DX center is formed. Thus, the electrical activity of the n-type impurity in the second part 19 of the first DBR 15 is high. Accordingly, almost all of the impurity (dopant) atoms are activated at a relatively low impurity concentration and a sufficient carrier concentration can be achieved. Thus, the impurity atoms rarely move between lattice sites. Since the first part 17 of the first DBR 15 is undoped, the impurity atoms do not move between the lattices. Thus, in the first DBR 15 of the semiconductor laser A, interdiffusion of the constituent elements between the semiconductor layers rarely occurs and deterioration of the reflectivity is suppressed.

A semiconductor laser C was fabricated by changing the composition of the semiconductor constituting the second part 19 of the first DBR 15 of the semiconductor laser A. In the semiconductor laser C, the second part 19 of the first DBR 15 is composed of Si-doped $In_{0.45}Ga_{0.55}P$/GaAs.

Figure 5B:
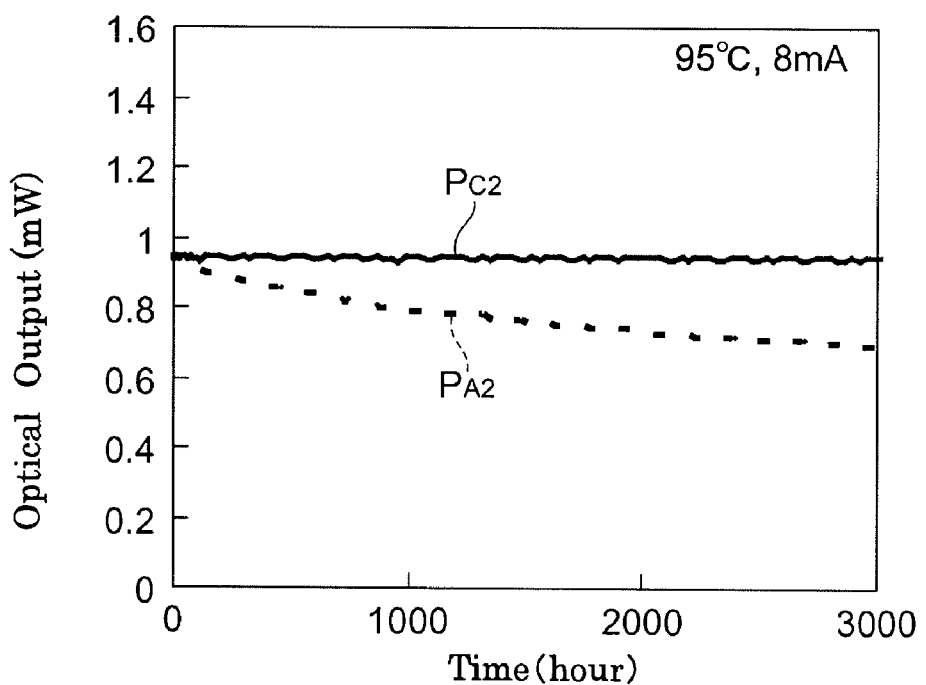

The results of the long-term current test of the semiconductor laser A and the semiconductor laser C are shown in FIG. 5B. The test conditions were a temperature of 95° C. under 8 mAACC driving. As marked by reference character $P_{C2}$, the output power of the semiconductor laser C remained substantially unchanged over 3,000 hours. In contrast, as marked by reference character $P_{A2}$, the output power of the semiconductor laser A decreased with time.

The first part 17 of the first DBR 15 of the semiconductor laser A has compressive strain, and thus stress from the first part 17 to the active layer 23 is generated. The stress introduces crystal defects into the active layer 23 when the semiconductor laser is driven, and non-radiative recombinations caused by the crystal defects occur more frequently. As a result, the output power decreases with time. In contrast, the second part 19 of the first DBR 15 of the semiconductor laser C is composed of Si-doped $In_{0.45}Ga_{0.55}P$/GaAs. Thus, the compressive strain in the first part 17 is compensated by the compressive strain in the second part 19. Thus, stress concentration in the active layer 23 is avoided.

Although the principle of the present invention has been described heretofore by way of preferred embodiments with reference to the drawings, it is obvious for persons skilled in the art that the arrangement and details of the present invention are subject to alteration and modification within the scope of the aforementioned principle. The present invention is not limited to the specific structures disclosed in the embodiment. Moreover, although semiconductor lasers are used as an example of the embodiment, the present invention is also applicable to semiconductor optical modulators, integrated devices including semiconductor optical modulators and semiconductor lasers, and the like. Thus the right over what is claimed in the claims below and all alterations and modifications within the scope of the claims is claimed.

What is claimed is:

1. A vertical cavity surface emitting laser comprising:

a GaAs substrate;

a first semiconductor distributed Bragg reflector disposed on the GaAs substrate, the first semiconductor distributed Bragg reflector including a first part and a second part on the first part;

a semiconductor mesa disposed on the first semiconductor distributed Bragg reflector, the semiconductor mesa including an active layer; and a second distributed Bragg reflector on the semiconductor mesa, wherein the second part of the first semiconductor distributed Bragg reflector includes a first region and a second region surrounding the first region;

the semiconductor mesa is disposed on the first region;

the first part of the first semiconductor distributed Bragg reflector includes first III-V group compound semiconductor layers and second III-V group compound semiconductor layers that are alternately stacked;

the second part of the first semiconductor distributed Bragg reflector includes third III-V group compound semiconductor layers and fourth III-V group compound semiconductor layers that are alternately stacked;

the first III-V group compound semiconductor layers are composed of an undoped semiconductor material containing aluminum and gallium as the group III element and arsenic as the group V element;

the second III-V group compound semiconductor layers are composed of an undoped semiconductor material containing gallium as the group III element and arsenic as the group V element;

the third III-V group compound semiconductor layers are composed of a semiconductor material that contains indium and gallium as the group III element and phosphorus as the group V element;

the fourth III-V group compound semiconductor layers are composed of a semiconductor material that contains gallium as the group III element and arsenic as the group V element; and the third III-V group compound semiconductor layers and the fourth III-V group compound semiconductor layers are doped with an n-type impurity.

2. The vertical cavity surface emitting laser according to claim 1, wherein the difference in refractive index between the first III-V group compound semiconductor layers and the second III-V group compound semiconductor layers is larger than the difference in refractive index between the third III-V group compound semiconductor layers and the fourth III-V group compound semiconductor layers.

3. The vertical cavity surface emitting laser according to claim 1, wherein the pair number of the first part of the first semiconductor distributed Bragg reflector is in a range from 20 to 40, and the pair number of the second part of the first semiconductor distributed Bragg reflector is in a range from 2 to 10.

4. The vertical cavity surface emitting laser according to claim 1, wherein the reflectivity of the first part of the first semiconductor distributed Bragg reflector is larger than the reflectivity of the second part of the first semiconductor distributed Bragg reflector.

5. The vertical cavity surface emitting laser according to claim 1, wherein the n-type impurity concentration of the second part of the first semiconductor distributed Bragg reflector is more than or equal to $5 \times 10^{17}$ cm$^{-3}$ and less than or equal to $5 \times 10^{18}$ cm$^{-3}$.

6. The vertical cavity surface emitting laser according to claim 1, wherein the first III-V group compound semiconductor layers are composed of an AlGaAs semiconductor or an AlAs semiconductor, and the second III-V group compound semiconductor layers are composed of a GaAs semiconductor or an AlGaAs semiconductor.

7. The vertical cavity surface emitting laser according to claim 1, wherein the third III-V group compound semiconductor layers are composed of an InGaP semiconductor, an AlGaInP semiconductor, or a GaInAsP semiconductor.

8. The vertical cavity surface emitting laser according to claim 1, wherein the first part of the first semiconductor distributed Bragg reflector has compressive strain;

the In content in the group III element of the third III-V group compound semiconductor layers is 0.4 or more and 0.5 or less;

the fourth III-V group compound semiconductor layers are composed of a GaAs semiconductor; and the second part of the first semiconductor distributed Bragg reflector has tensile strain.

9. The vertical cavity surface emitting laser according to claim 1, wherein the first part of the first semiconductor distributed Bragg reflector has compressive strain;

the In content in the group III element of the third III-V group compound semiconductor layers is 0.4 or more and 0.6 or less;

the fourth III-V group compound semiconductor layers are composed of a GaAsP semiconductor; and the second part of the first semiconductor distributed Bragg reflector has tensile strain.

10. The vertical cavity surface emitting laser according to claim 1, further comprising an insulator layer disposed on the second region of the second part of the first semiconductor distributed Bragg reflector and a side surface of the semiconductor mesa, the insulator layer having an opening in a portion of the insulator layer on the second region;

a first electrode formed in the opening; and a second electrode formed on the semiconductor mesa and the insulator layer.

11. The vertical cavity surface emitting laser according to claim 1, wherein the active layer has a quantum well structure including InGaAs well layers.

* * * * *